(12) United States Patent
Law et al.

(10) Patent No.: US 8,772,930 B2
(45) Date of Patent: Jul. 8, 2014

(54) INCREASED SURFACE AREA ELECTRICAL CONTACTS FOR MICROELECTRONIC PACKAGES

(75) Inventors: Pui Chung Simon Law, Hong Kong (HK); Dan Yang, Hong Kong (HK); Xunqing Shi, Hong Kong (HK)

(73) Assignee: Hong Kong Applied Science and Technology Research Institute Company Limited, Hong Kong Science Park Shatin, New Territories, Hong Kong (CN)

(*) Notice: Subject to any disclaimer, the term of this patent is extended or adjusted under 35 U.S.C. 154(b) by 0 days.

(21) Appl. No.: 13/354,302

(22) Filed: Jan. 19, 2012

(65) Prior Publication Data

US 2013/0187267 A1 Jul. 25, 2013

(51) Int. Cl.
*H01L 23/498* (2006.01)

(52) U.S. Cl.
USPC ........... 257/737; 257/81; 257/99; 257/624; 438/640; 438/668; 438/672; 438/675

(58) Field of Classification Search
USPC ............................. 257/686, 434, 432, 730
See application file for complete search history.

(56) References Cited

U.S. PATENT DOCUMENTS

| | | | |
|---|---|---|---|
| 7,274,101 B2 * | 9/2007 | Tomita et al. | 257/730 |
| 7,393,758 B2 * | 7/2008 | Sridhar et al. | 438/460 |
| 7,808,064 B2 * | 10/2010 | Kawasaki et al. | 257/432 |
| 7,964,926 B2 * | 6/2011 | Kim | 257/431 |
| 2007/0099395 A1 * | 5/2007 | Sridhar et al. | 438/460 |
| 2008/0237766 A1 * | 10/2008 | Kim | 257/432 |
| 2008/0284041 A1 | 11/2008 | Jang et al. | |
| 2009/0050996 A1 * | 2/2009 | Liu et al. | 257/434 |
| 2009/0283847 A1 * | 11/2009 | Kawasaki et al. | 257/432 |
| 2010/0230795 A1 * | 9/2010 | Kriman et al. | 257/686 |
| 2011/0278734 A1 * | 11/2011 | Yen et al. | 257/774 |

FOREIGN PATENT DOCUMENTS

| | | |
|---|---|---|
| CN | 101847664 A | 9/2010 |
| TW | 200937605 A | 9/2009 |

OTHER PUBLICATIONS

Office Action issued from the State Intellectual Property Office of the People's Republic of China on Mar. 3, 2014.

* cited by examiner

*Primary Examiner* — Julio J Maldonado
*Assistant Examiner* — Jaehwan Oh
(74) *Attorney, Agent, or Firm* — Ella Cheong Hong Kong; Sam T. Yip

(57) ABSTRACT

A multilayer microelectronic device package includes one or more vertical electrical contacts. At least one semiconductor material layer is provided having one or more electrical devices fabricated therein. An electrical contact pad can be formed on or in the semiconductor material layer. Another material layer is positioned adjacent to the semiconductor material layer and includes a conductive material stud embedded in or bonded to the layer. A via is formed through at least a portion of the semiconductor material layer and the electrical contact pad and into the adjacent layer conducting material stud. The via is constructed such that the via tip terminates within the conducting material stud, exposing the conducting material. A metallization layer is disposed in the via such that the metallization layer contacts both the electrical contact pad and the conducting material stud exposed by the via tip.

20 Claims, 11 Drawing Sheets

INCREASED SURFACE AREA ELECTRICAL CONTACTS FOR MICROELECTRONIC PACKAGES

FIELD OF THE INVENTION

The invention relates to electrical contacts for microelectronic packages and, more particularly, large surface area contacts for reliable electrical connection between electronic elements.

BACKGROUND

Semiconductor packaging becomes increasingly difficult as the size of devices becomes smaller and as packages increase in complexity, such as those including multilayer vertically stacked semiconductor chips. In particular, electrical connections between devices and to external power supplies become more challenging.

Conventional processes for forming electrical contacts typically involve expensive photolithography and etching to expose a thin bonding pad. Such a technique is described in U.S. Pat. No. 7,808,064. However, etching can sometimes thin or otherwise damage the bonding pad, leading to an unacceptably high device rejection rate.

In other known processes, laser drilling is used to form a void through a thin bonding pad. This is shown in US 2010/0230795. However, subsequent metallization results in an extremely small area of contact between the metallization and the bonding pad; only an annular ring of metallization contacts an annular ring of the thin bonding pad. This small area of contact can lead to device failure, particularly if the metallization does not make good contact with the annular ring of the bonding pad.

Thus, there is a need in the art for improved electrical contacts in multilayer microelectronic device packages that are reliable and easy to fabricate.

SUMMARY OF THE INVENTION

In one aspect, the invention relates to a multilayer microelectronic device package that includes one or more vertical electrical contacts. At least one semiconductor material layer is provided having one or more electrical devices fabricated therein. An electrical contact pad can be formed on or in the semiconductor material layer.

Another material layer is positioned adjacent to the semiconductor material layer. The material layer includes a conductive material stud embedded in the layer or bonded to the layer.

A metallization via is formed through at least a portion of the semiconductor material layer and through the electrical contact pad and into the conducting material stud of the adjacent layer. The via is constructed such that the tip of the via terminates within the conducting material stud. In this manner, the entire via tip exposes the conducting material.

A metallization layer is disposed in the metallization via such that the metallization layer contacts both the electrical contact pad and the conducting material stud through the region exposed by the metallization via tip.

DETAILED DESCRIPTION

The invention provides a cost-effective and reliable electrical connection for multilayer semiconductor device packages. In the invention, a metallized via makes electrical contact with both a bonding pad and with a thicker conductive material stud beneath the bonding pad. Prior to metallization, the formed via terminates within the thicker conductive material stud to ensure metallization electrical contact over a large region. Various embodiments of this invention are depicted in the following FIGS. 1-10 for different devices and different multilayer configurations; however, all the embodiments share the above features in common.

As used herein, the term "via" is used in a broad sense to mean any opening in an electrical material layer or layers, typically including a path through an insulating material layer, that allows a conductive connection between different layers. Various other similar terms such as trench or channel are encompassed by the term "via" as used in describing the present invention.

Note that in the following embodiments, the conductive material stud is formed on or in a glass wafer; this is because many of the embodiments relate to packaging a CMOS-based image sensor in which a transparent material is used as a cover layer to permit imaging. However, when other devices are formed, such as multilayer semiconductor integrated circuits, the conductive material stud is not required to be formed in a glass layer or in a transparent material layer. That is, the conductive material stud can be formed in any adjacent material layer to facilitate electrical connection with a bonding pad.

The term "conductive material stud" as used herein, relates to a thick plug of conductive material, with a thickness on the order of 5 um to 200 um that is, a thickness substantially larger than the thickness of a conventional bonding pad, which tends to be on the order of 0.5 um to 5 um. The conductive material can be selected from a metal/metal alloy such as gold, copper, aluminum and alloys thereof, conductive metal compounds such as titanium nitride and metal silicides, or transparent conductors such as indium tin oxide.

The following figures depict exemplary embodiments only; as can be seen from the variety of geometries and formation techniques, the invention applies to a large number of conductive material contacts for various electrical devices and device packages.

Figure 1:
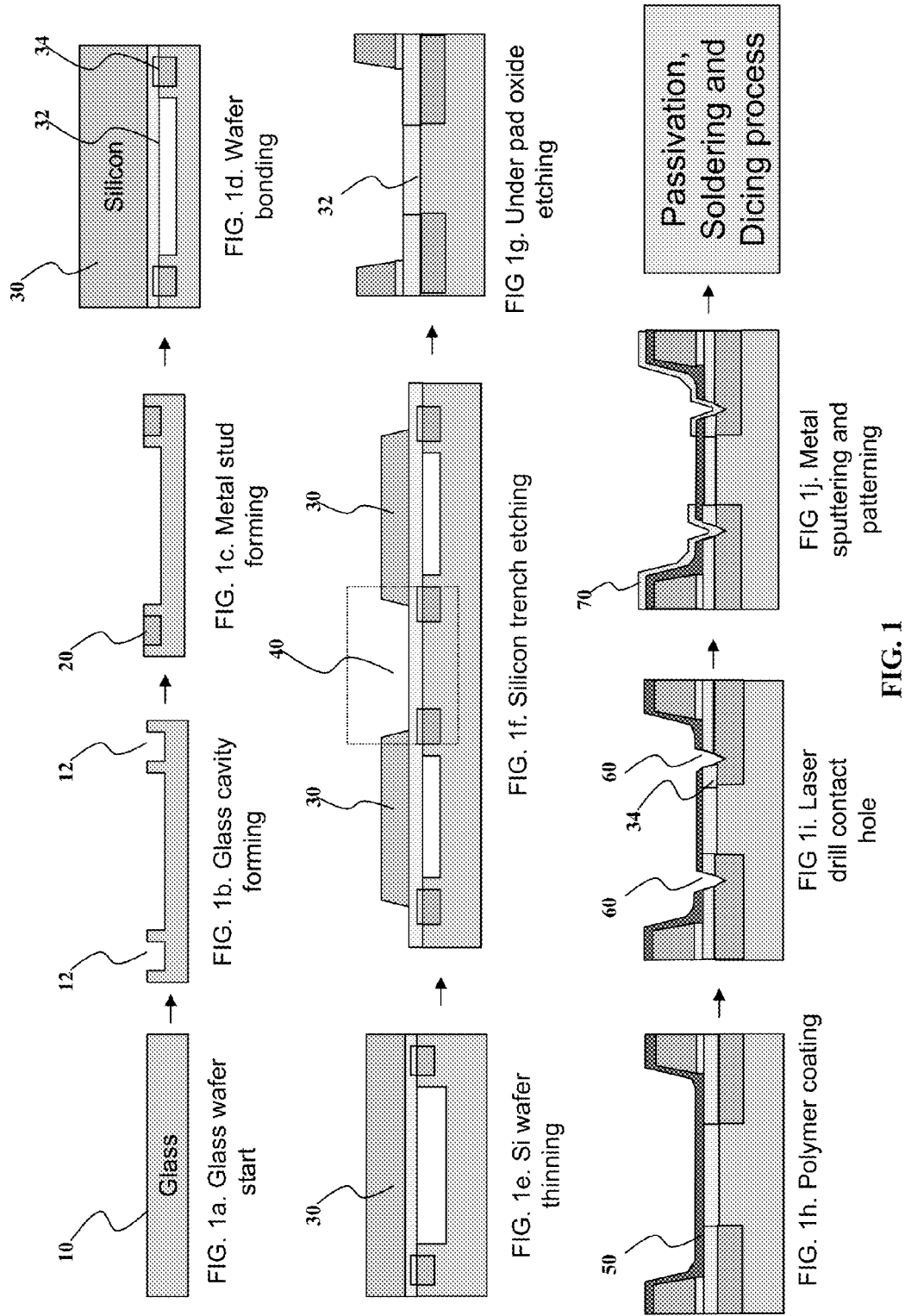
FIGS. 1a-1j depict a process for forming an electrical contact and the resultant device according to one aspect of the present invention.

FIG. 1 depicts a glass substrate 10 (1a) in which cavities 12 are formed (1b). The cavities can be formed by mechanical or chemical material removal techniques as are known in the art. Conductive material studs 20 are formed in cavities 12 (1c) through any known thin film or thick film deposition technique. A semiconductor wafer 30 has one or more electrical devices formed therein (not shown) and a dielectric layer 32 and one or more bonding pads 34 formed thereon. As depicted in FIG. 1d, the semiconductor wafer 30 is silicon although other semiconductor materials, such as compound semiconductors, can also be used. When the semiconductor wafer is silicon, the dielectric layer 32 is typically silicon dioxide, which can be thermally grown, although other dielectrics can also be used. The semiconductor wafer is bonded to the glass wafer at the projections that hold conductive material studs 20. Any suitable methods, such as direct bonding, can be used to perform the bonding, or other bonding materials can be applied.

The semiconductor wafer 30 is thinned (1e) followed by trench formation 40 (1f). A portion of dielectric 32 is removed to expose bonding pad 34 (1g) followed by a polymer coating 50 (1h). A via 60 is opened through the polymer coating (1i). Via 60 passes through bonding pad 34 and terminates in conductive material stud 20 and may be performed by laser drilling or another suitable via formation technique. Since the via terminates within conductive material stud 20, it opens up a large area of conductive material. That is, the entire via tip exposes conductive material. Since this conductive material also contacts bonding pad 34, a reliable electrical contact with the bonding pad can be formed when the via is metallized. Subsequent metallization 70 (1j) creates a large area of electrical contact with conductive material 20 and bonding pad 34 because the entire via tip terminates in the conductive material stud 20. In comparison with conventional annular contact with a bonding pad only, the contact area between metallization 70 and a conductive material (either bonding pad 34 or stud 20) is approximately 8-10 times greater.

To complete packaging, further processes are performed such as passivation, solder application, dicing into individual devices, encapsulation, etc. as are known in the semiconductor packaging art.

Turning to FIGS. 2-10, it is noted that the last two digits of the element numbers in these figures relate to elements that are substantially similar to elements described with reference to FIG. 1. Thus in FIG. 2a element 210 is a glass substrate (substantially similar to glass substrate 10 in FIG. 1), 212 are cavities formed in the glass substrate (2b) with conductive material studs 220 (2c), etc. Wafer thinning is performed in 2e. In 2f, a through silicon via 240 is formed by deep reactive ion etching. Removal of the dielectric/oxide 232 exposes bonding pad 234 (2g). Polymer coating 250 is formed in 2h followed by laser drilling a hole 260 through bonding pad 234 and into stud 220, terminating within the stud (2i). Metallization 270 is coated on the sidewalls of the via and the laser-drilled holes, typically by sputtering (2j). As with FIG. 1, further packaging processes are performed to create the final device.

Figure 2:
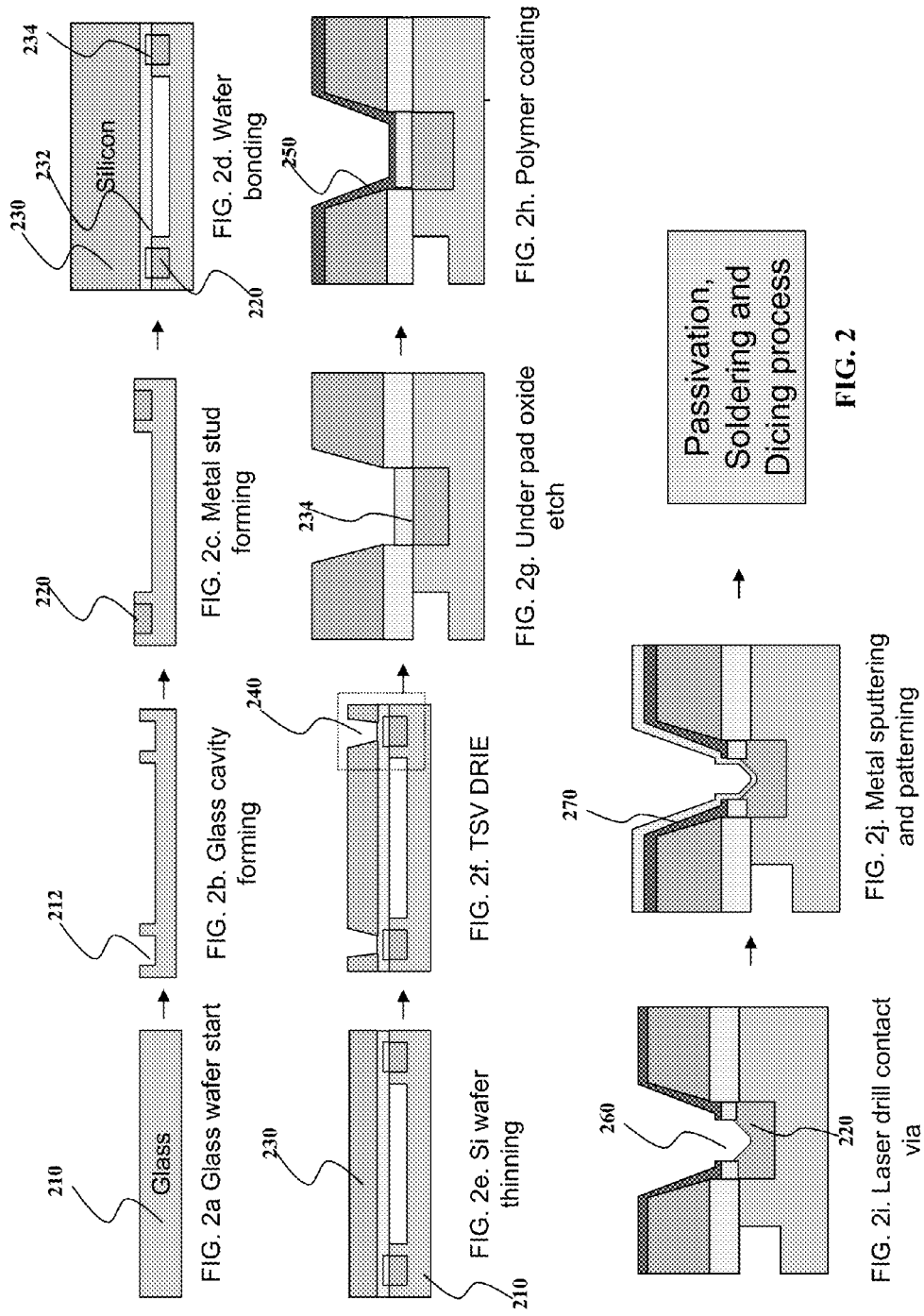
FIGS. 2a-2j depict a process for forming an electrical contact and the resultant device according to another aspect of the present invention.
Figure 3:
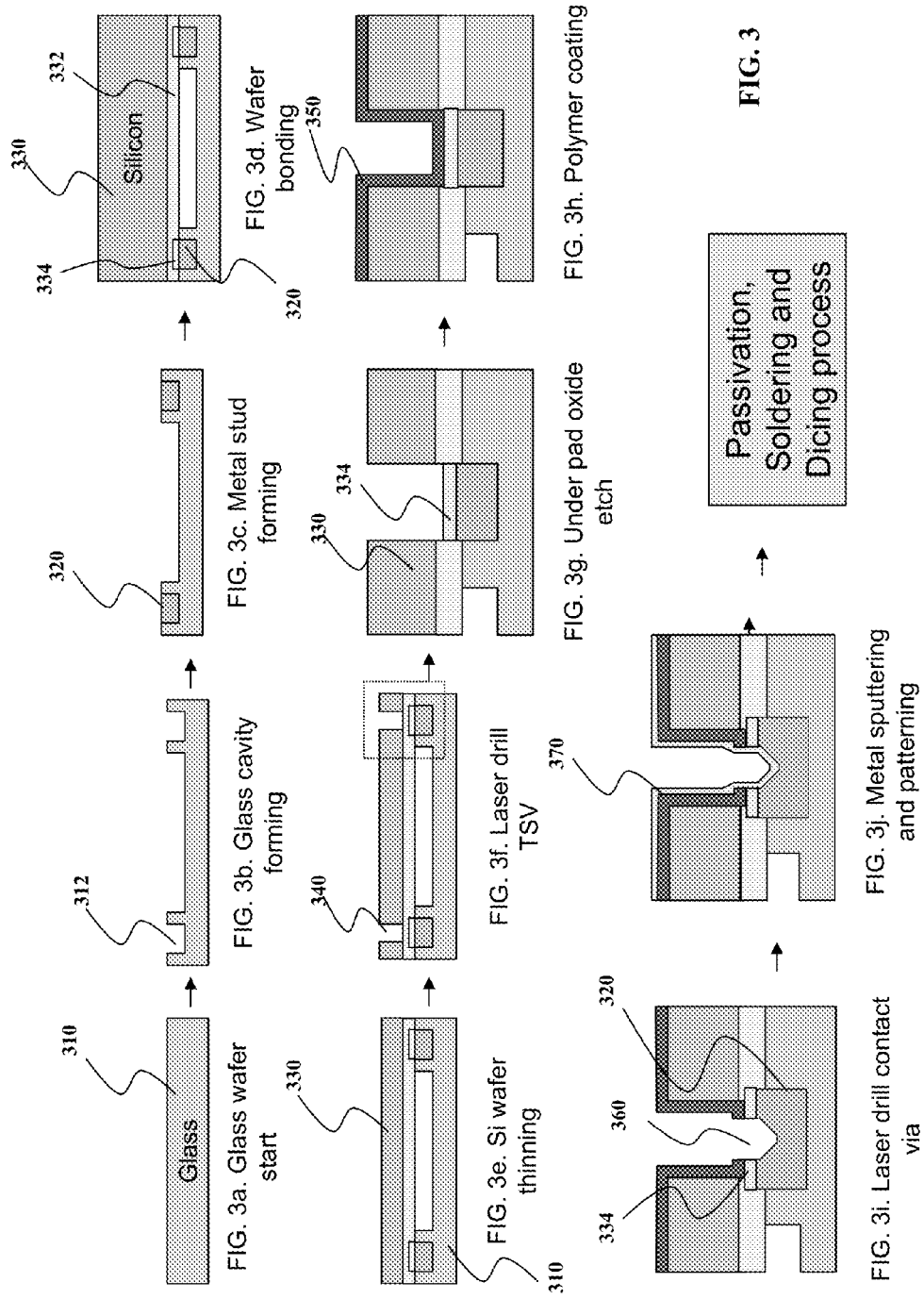
FIGS. 3a-3j depict a process for forming an electrical contact and the resultant device according to another aspect of the present invention.

In FIG. 3, subparts a-e are substantially similar to a-e of FIGS. 1 and 2. In 3f, laser drilling is used to form vias 340, and dielectric/oxide removal exposes bonding pad 334 (3g). Polymer 350 is coated in the via and laser drilling forms hole 360 through the bonding pad 334 and terminating in stud 320 (3i). Metallization 370 is deposited by sputtering or another suitable technique (3j) followed by conventional packaging.

Figure 4:
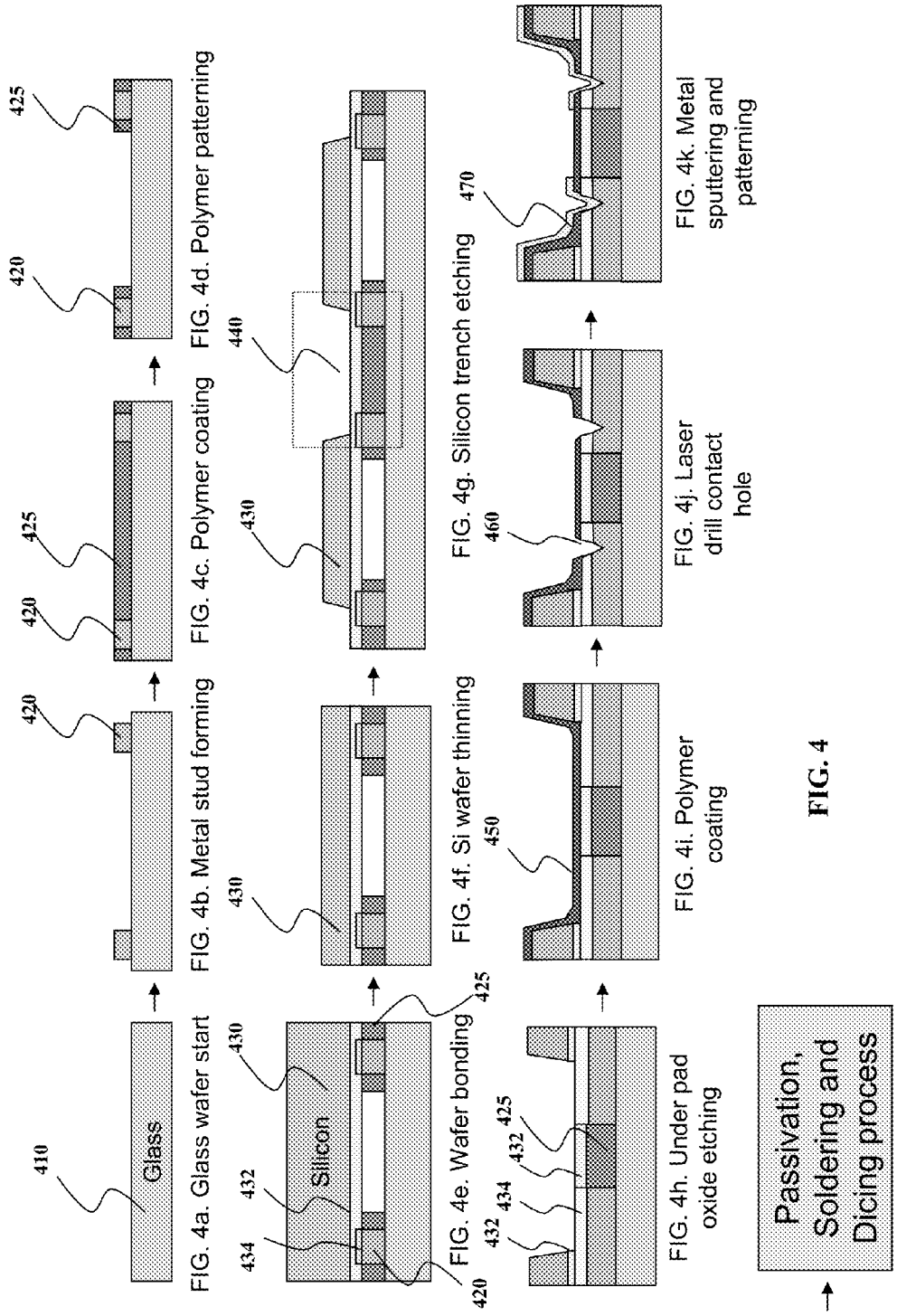
FIGS. 4a-4k depict a process for forming an electrical contact and the resultant device according to another aspect of the present invention.
Figure 5:
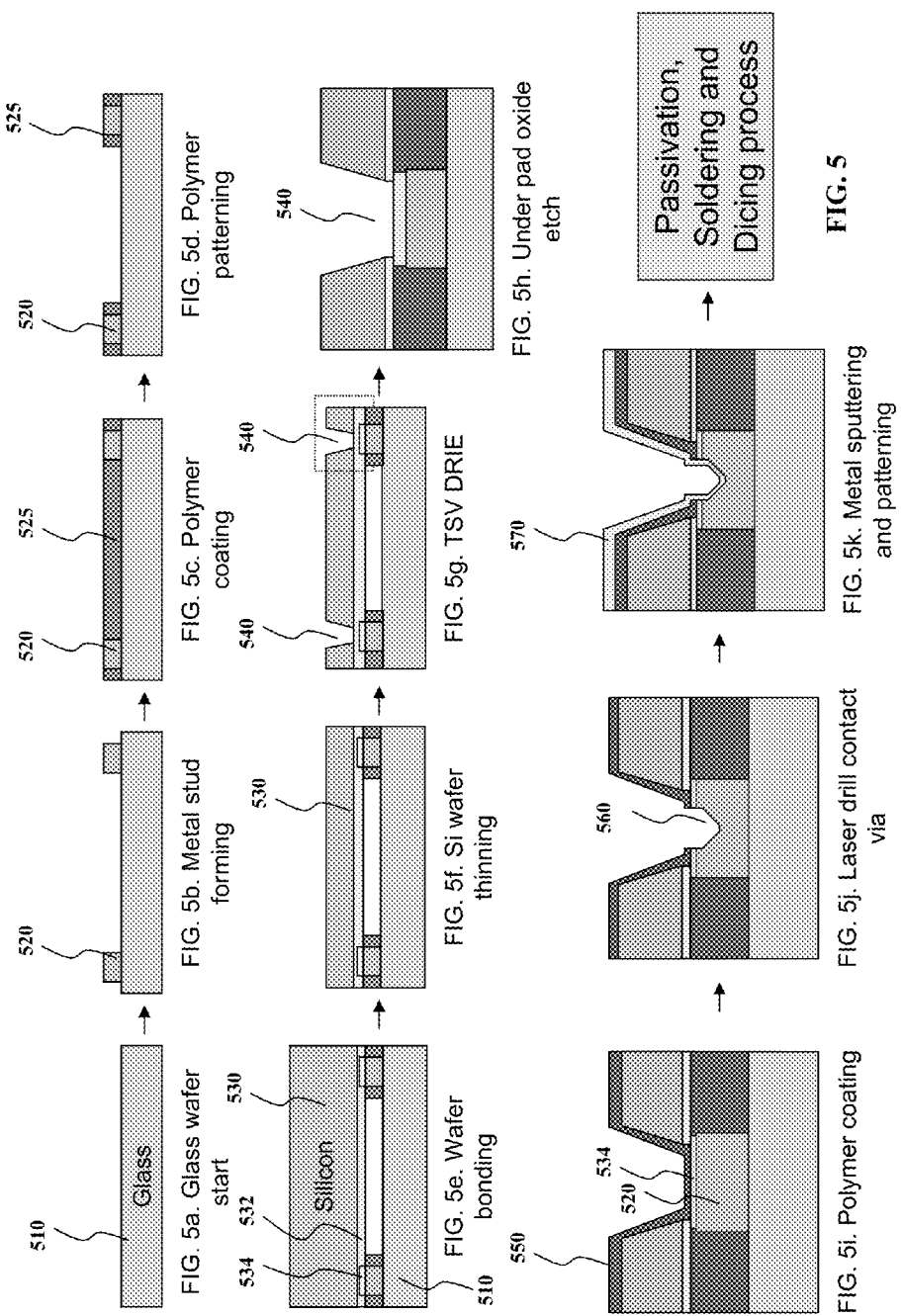
FIGS. 5a-5k depict a process for forming an electrical contact and the resultant device according to another aspect of the present invention.
Figure 6:
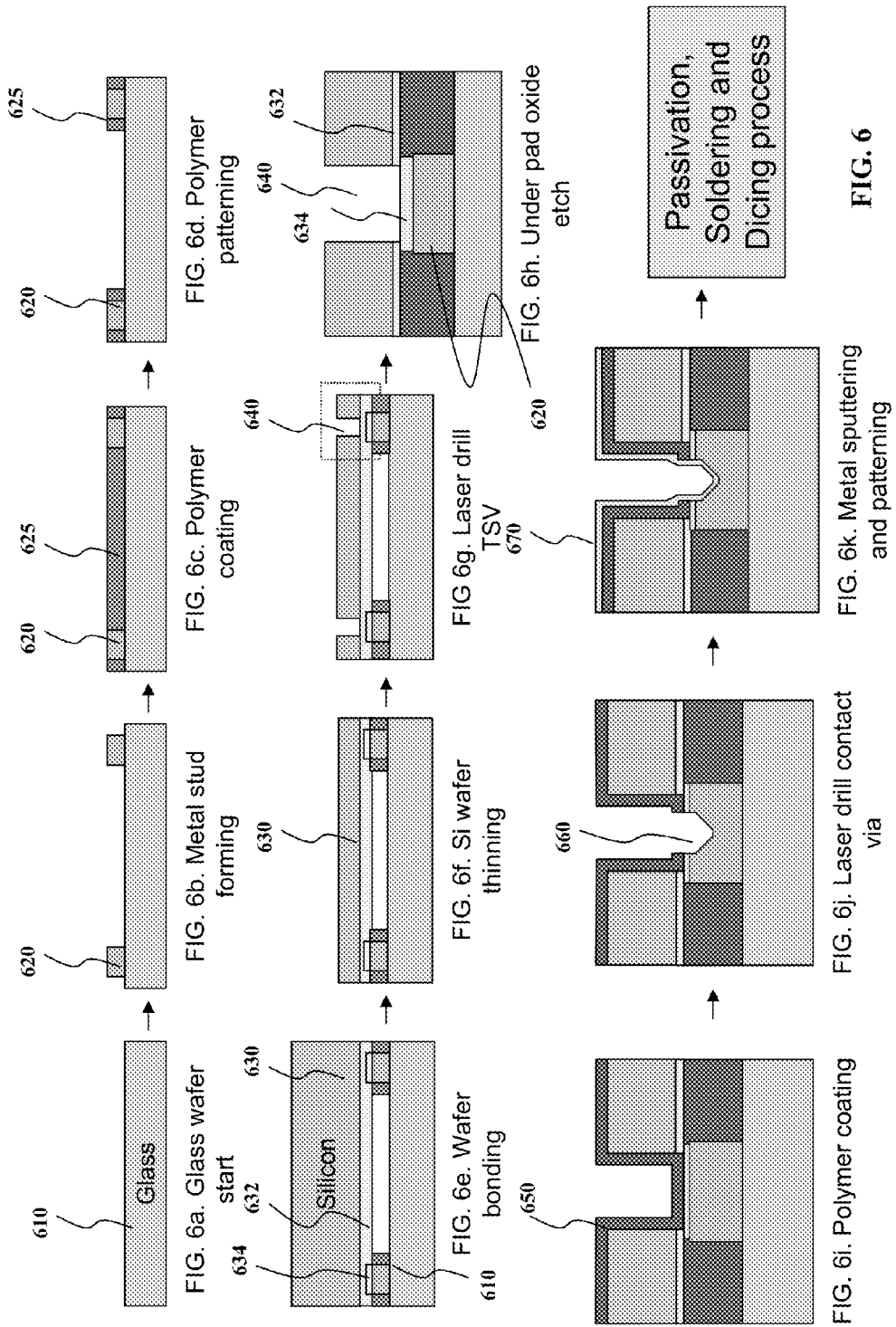
FIGS. 6a-6k depict a process for forming an electrical contact and the resultant device according to another aspect of the present invention.

In FIG. 4 conductive material studs 420 are formed on the surface of a glass substrate 410 rather than being embedded in a glass cavity (4a, 4b). A polymer coating 425 embeds the studs in a polymer layer; subsequent patterning of the polymer layer yields projecting studs encased in polymer. A semiconductor material 430 with dielectric/oxide layer 432 and bonding pads 434 is bonded to the glass substrate with projecting studs in 4e followed by wafer thinning in 4f. The remaining portions of FIG. 4 are substantially similar to those of FIG. 1.

Various combinations of the above features can be provided to a device and various process steps can be combined with other process steps in the present invention. For example, in FIG. 5, 5a-5f are substantially similar to 4a-4f. 5g-5k are substantially similar to FIG. 2. Similarly, in FIG. 6, 6a-6f are substantially similar to 4a-4f while 6g-6j are substantially similar to 3f-3j.

Figure 7:
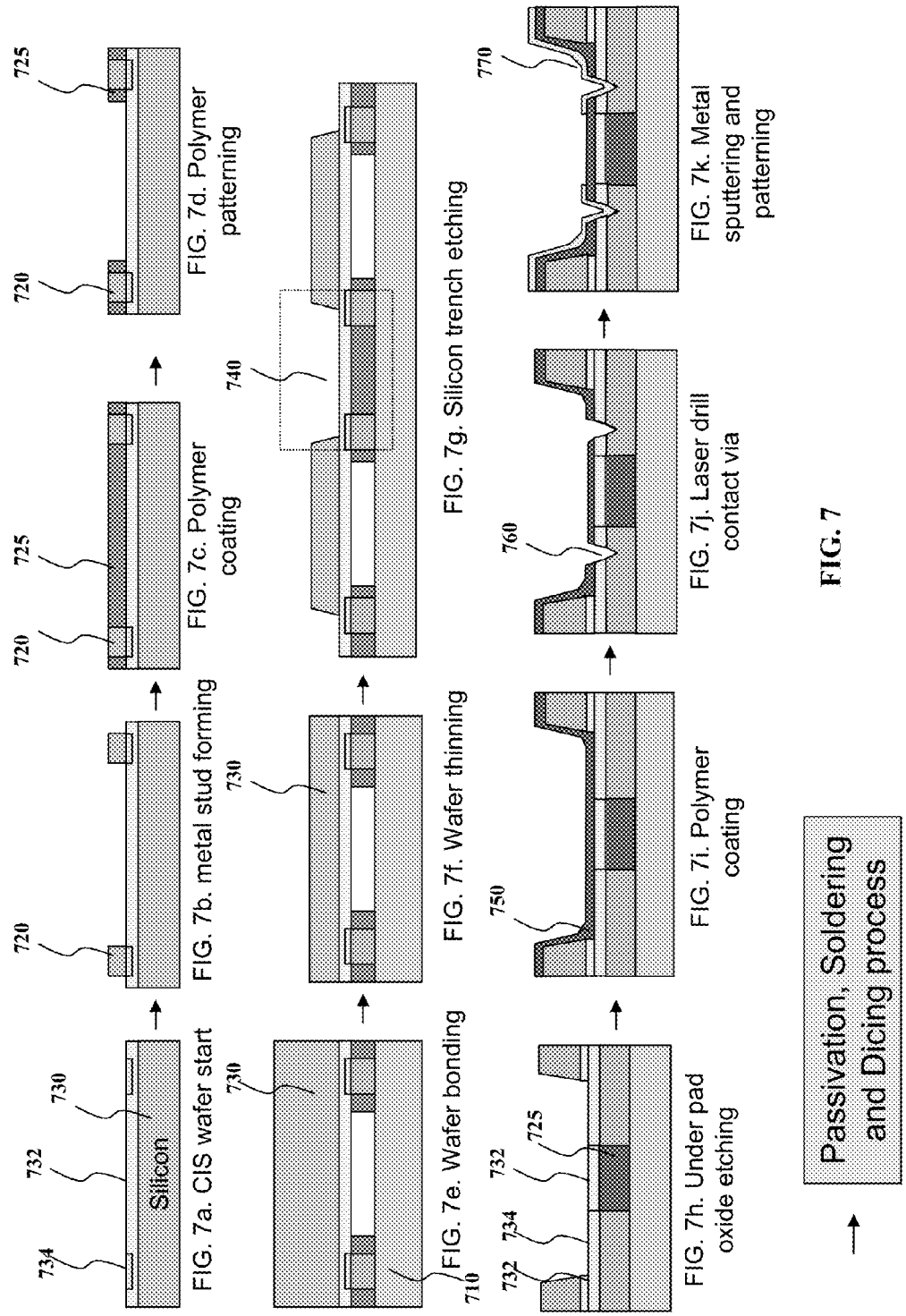
FIGS. 7a-7k depict a process for forming an electrical contact and the resultant device according to another aspect of the present invention.
Figure 8:
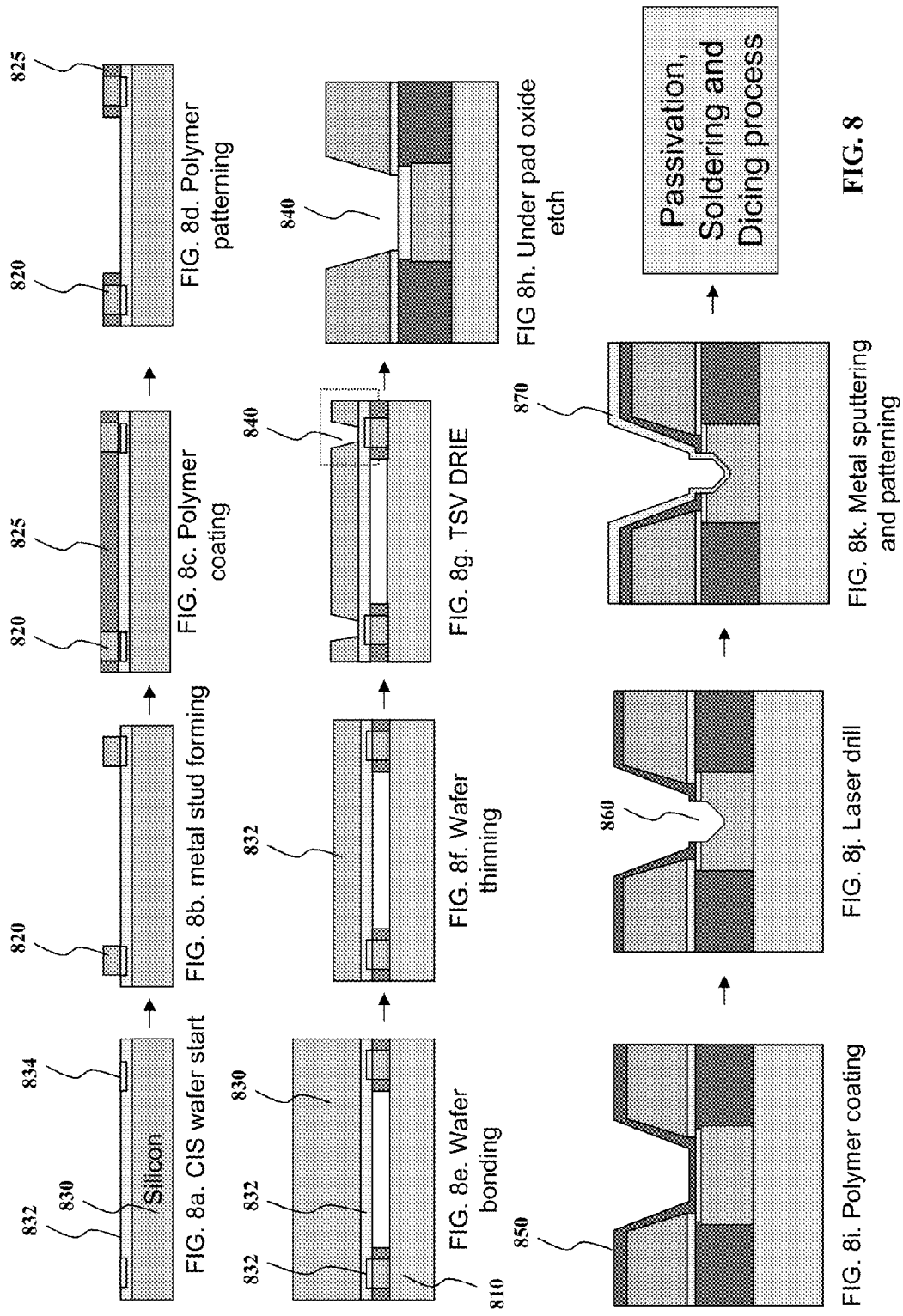
FIGS. 8a-8k depict a process for forming an electrical contact and the resultant device according to another aspect of the present invention.
Figure 9:
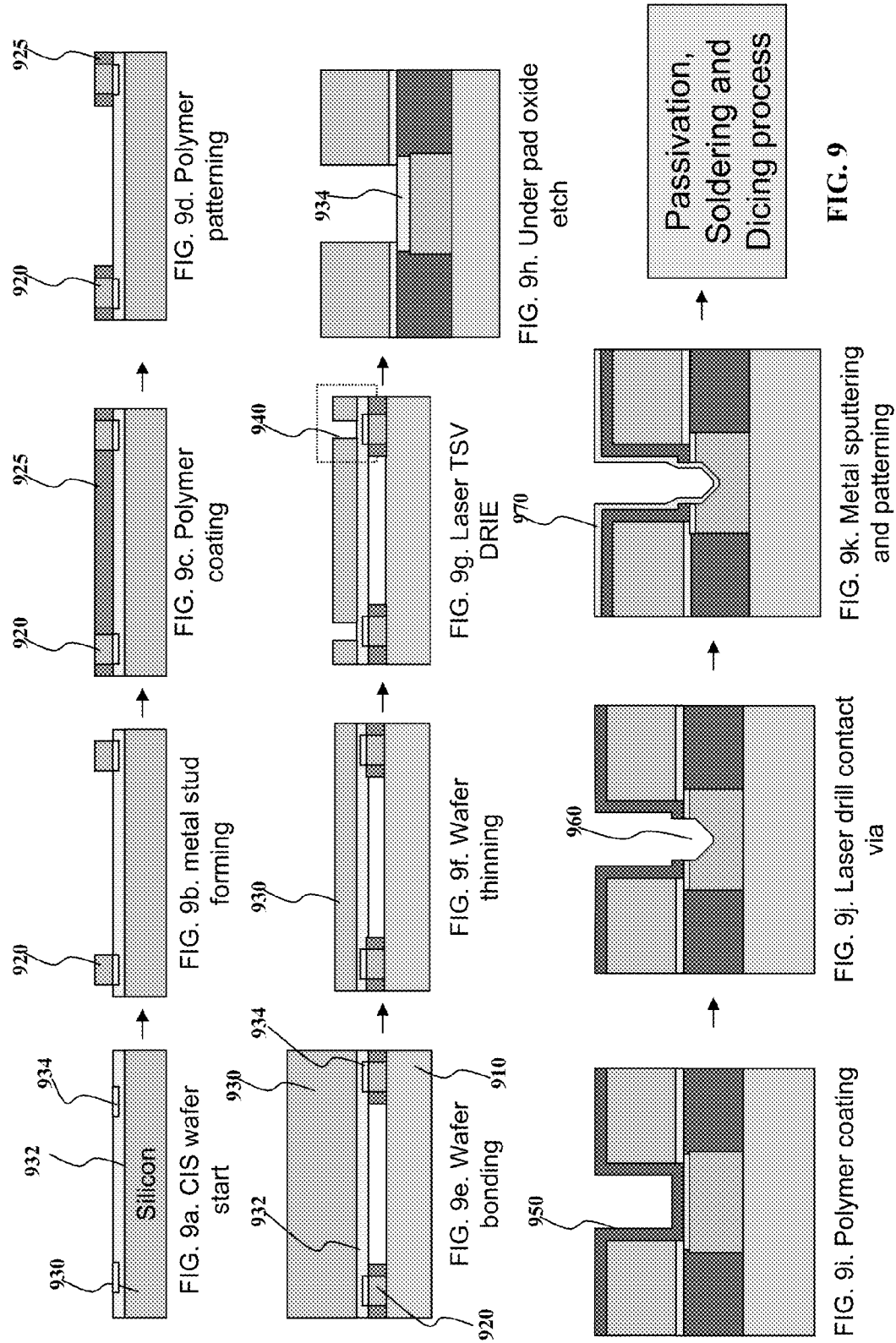
FIGS. 9a-9k depict a process for forming an electrical contact and the resultant device according to another aspect of the present invention.

In FIG. 7, a CMOS image sensor (CIS) 730 is provided (7a) having bonding pads 734 formed in dielectric layer 732 (e.g., silicon oxide or a polymer) and conductive material studs 720 are formed over the dielectric/oxide layer 732 having bonding pads 734 formed therein or thereon (7b). A polymer coating 725 embeds the studs followed by polymer patterning to yield stud projections on the CIS wafer. A glass wafer 710 is bonded to the CIS/stud projection combination followed by trench etching 740 and oxide removal exposing bonding pads 734 (7g-7h). A polymer coating 750 is deposited (7i) followed by laser drilling forming holes 760 that terminate in the stud. Metallization 770 covers the trench and both holes, followed by metal removal between the adjacent holes (for electrical isolation).

In FIG. 8, 8a-8f are substantially similar to 7a-7f. FIG. 8g-8k are substantially similar to 2f-2j. In FIG. 9, 9a-9f are substantially similar to 7a-7f. FIG. 9g-9k are substantially similar to 3f-3j.

Figure 10:
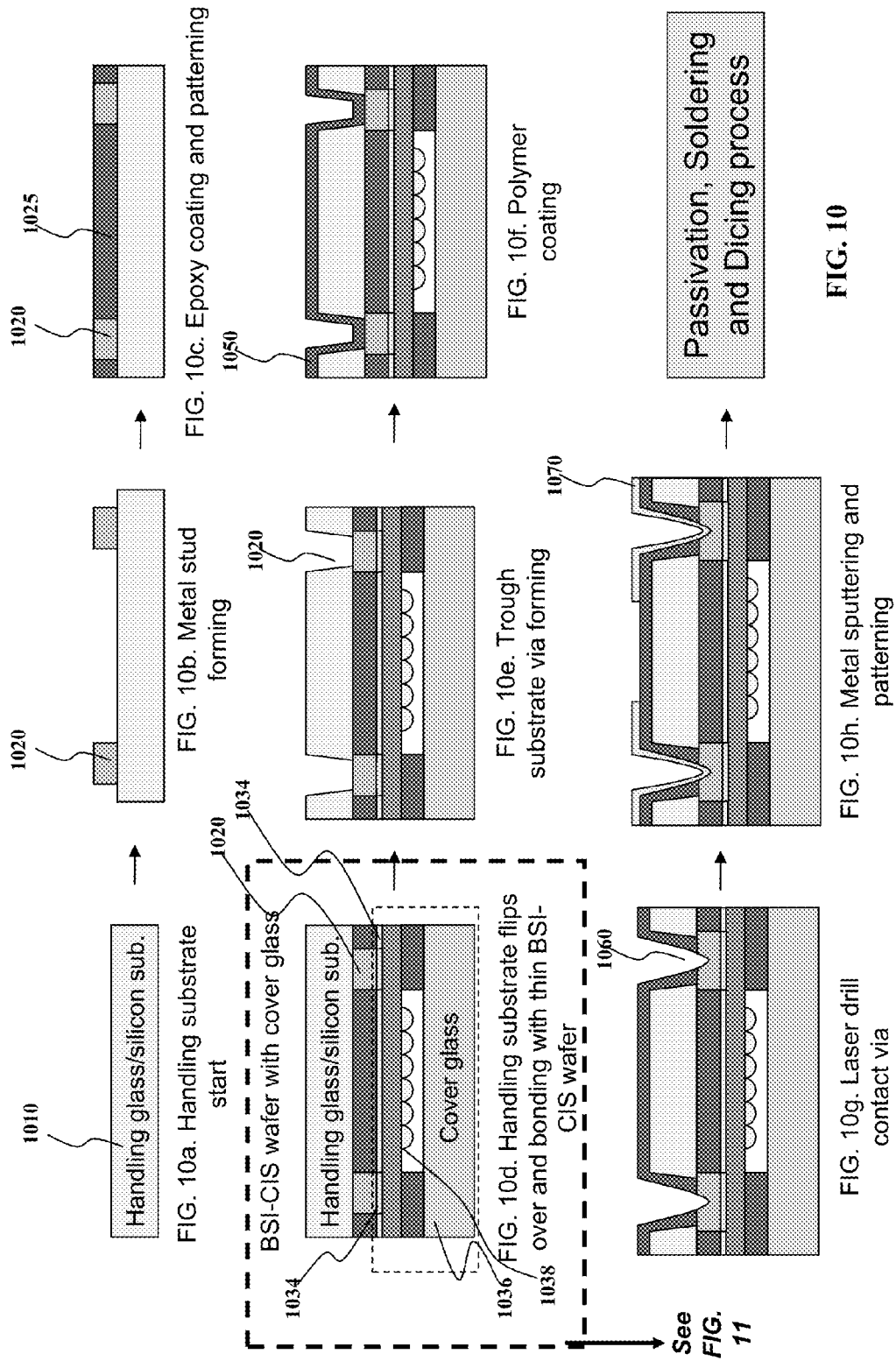
FIGS. 10a-10h depict a process for forming an electrical contact and the resultant device according to another aspect of the present invention.
Figure 11:
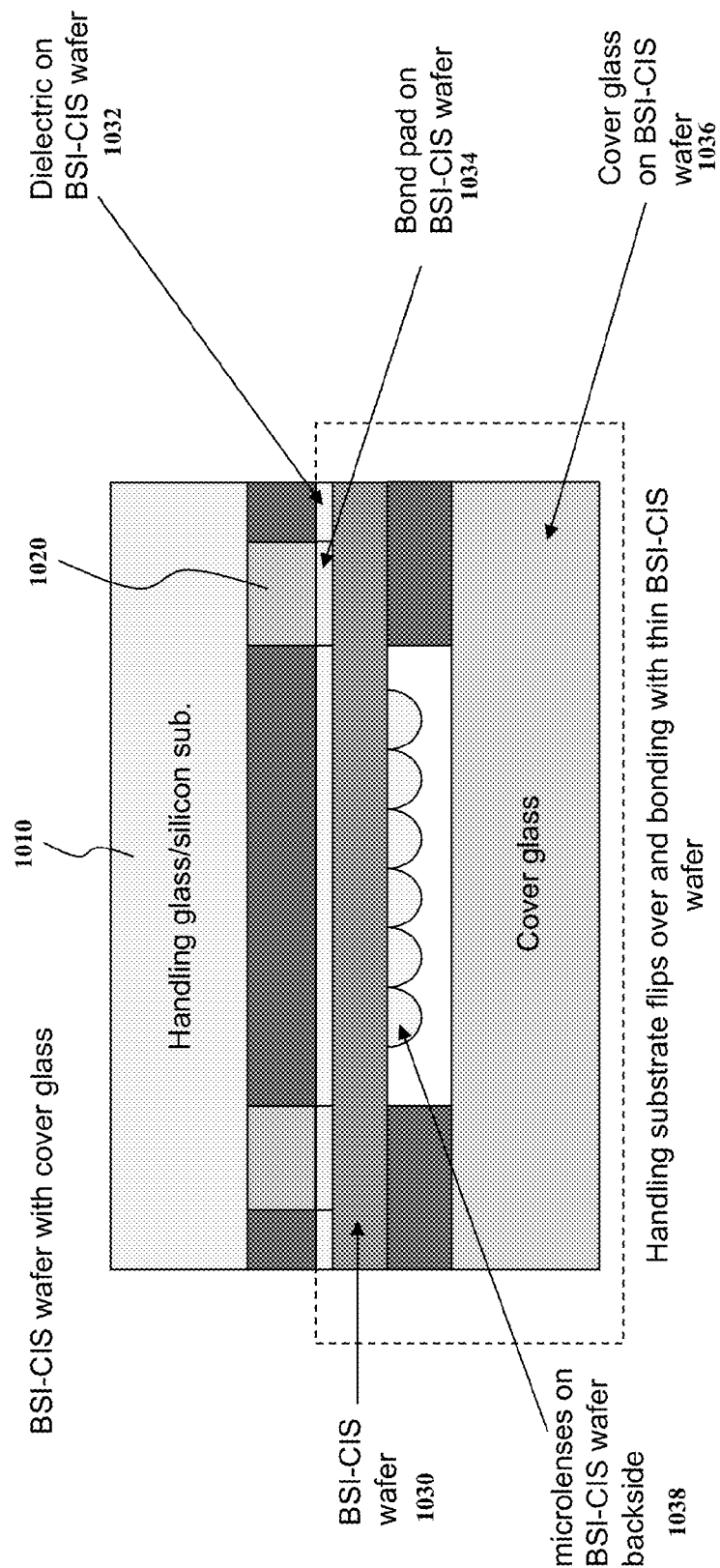
FIG. 11 is an enlarged version of FIG. 10d.

FIG. 10 depicts formation of a backside illuminated (BSI) CIS device package. A handling glass/silicon substrate 1010 is provided with conductive material stud projections 1020 which are embedded in a polymer layer 1025 (10a-10c). A BSI-CIS wafer 1030 with a dielectric/oxide 1032 and bonding pads 1034 and cover glass 1036 and lenses 1038 is bonded to the handling substrate plus metal studs embedded in polymer formed in 10a-10c. Vias 1040 are formed in the handling substrate in 10e followed by polymer deposition 1050 laser drilling to form contact vias 1060 and metallization 1070.

The foregoing has outlined the features and technical advantages of the present invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

The invention claimed is:

1. A microelectronic device package including one or more electrical contacts comprising:
    a semiconductor material layer having one or more electrical devices fabricated therein and having an electrical contact pad positioned therein;
    a layer positioned adjacent to the semiconductor material layer, the layer including a conducting material stud embedded in or formed on the layer or bonded to the layer, wherein the conducting material stud is positioned beneath the electrical contact pad;

a via formed through at least a portion of the semiconductor material layer and through the electrical contact pad and into the conducting material stud, wherein the conducting material stud relates to a thick plug of conductive material with a thickness on the order of 5 um to 200 um which is the thickness substantially larger than the thickness of the electrical contact pad, and the conducting material stud, positioned beneath the electrical contact pad, is in physical and electrical contact with the electrical contact pad, and the tip of the via terminates within at least a portion of the conducting material stud opening up an area of the conductive material performed by a via formation technique such that the entire via tip exposes the area of the conductive material of the conducting material stud, wherein the formed via terminates within the conducting material stud to ensure metallization of the electrical contact over a large region; and a metallization layer disposed in the via such that the metallization layer contacts the electrical contact pad and the area of the conductive material of the conducting material stud through the via tip to have electrical contact with both the electrical contact pad and the conductive material stud, wherein the metallization layer, the electrical contact pad and the conducting material stud are in physical and electrical contact among each other.

2. A multilayer microelectronic device package including one or more vertical electrical contacts according to claim 1 wherein the conducting material stud comprises a metal, a metal alloy, or a conductive metal compound.

3. A multilayer microelectronic device package including one or more vertical electrical contacts according to claim 1 wherein the via is formed by laser drilling.

4. A multilayer microelectronic device package including one or more vertical electrical contacts according to claim 1 wherein the via is formed by mechanical material removal.

5. A multilayer microelectronic device package including one or more vertical electrical contacts according to claim 1 wherein the semiconductor material is silicon.

6. A multilayer microelectronic device package including one or more vertical electrical contacts according to claim 1 wherein a CMOS imaging device is formed in the semiconductor material layer.

7. A multilayer microelectronic device package including one or more vertical electrical contacts according to claim 1 wherein the stud-containing layer is a glass layer.

8. A multilayer microelectronic device package including one or more vertical electrical contacts according to claim 1 wherein the adjacent layer with conducting material stud is formed on the semiconductor material layer.

9. A multilayer microelectronic device package including one or more vertical electrical contacts according to claim 1 wherein the adjacent layer with conducting material stud is bonded to the semiconductor layer.

10. A multilayer microelectronic device package including one or more vertical electrical contacts according to claim 1 wherein the thickness of the electrical contact pad is on the order of 0.5 um to 5 um.

11. A multilayer microelectronic device package including one or more vertical electrical contacts according to claim 1 wherein the via is positioned in a trench formed by trench etching of the semiconductor material layer.

12. A multilayer microelectronic device package including one or more vertical electrical contacts according to claim 1 wherein the via is positioned in a through silicon via formed by deep reactive ion etching or laser drilling of the semiconductor material layer.

13. A multilayer microelectronic device package including one or more vertical electrical contacts according to claim 1 further comprising:
    a polymer coating positioned between the layer and the metallization layer.

14. A microelectronic device package including one or more electrical contacts comprising:
    a semiconductor material layer having one or more electrical devices fabricated therein and having an electrical contact pad positioned therein;
    a layer positioned adjacent to the semiconductor material layer, the layer including a conducting material stud embedded in or formed on the layer or bonded to the layer, wherein the conducting material stud is positioned beneath the electrical contact pad;
    a via formed through at least a portion of the semiconductor material layer and through the electrical contact pad and into the conducting material stud, wherein the conducting material stud relates to a thick plug of conductive material with a thickness on the order of 5 um to 200 um which is the thickness substantially larger than the thickness of the electrical contact pad being on the order of 0.5 um to 5 um, and the conducting material stud, positioned beneath the electrical contact pad, is in physical and electrical contact with the electrical contact pad, and the tip of the via terminates within at least a portion of the conducting material stud opening up an area of the conductive material performed by a via formation technique such that the entire via tip exposes the area of the conductive material of the conducting material stud and the electrical contact pad, wherein the formed via terminates within the conducting material stud to ensure metallization of the electrical contact over a large region; and
    a metallization layer disposed in the via such that the metallization layer contacts the electrical contact pad and the area of the conductive material of the conducting material stud through the via tip to have electrical contact with both the electrical contact pad and the conductive material stud, wherein the metallization layer, the electrical contact pad and the conducting material stud are in physical and electrical contact among each other.

15. A multilayer microelectronic device package including one or more vertical electrical contacts according to claim 14 wherein the conducting material stud comprises a metal, a metal alloy, or a conductive metal compound.

16. A multilayer microelectronic device package including one or more vertical electrical contacts according to claim 14 wherein the via is formed by laser drilling.

17. A multilayer microelectronic device package including one or more vertical electrical contacts according to claim 14 wherein the via is formed by mechanical material removal.

18. A multilayer microelectronic device package including one or more vertical electrical contacts according to claim 14 wherein the semiconductor material is silicon.

19. A multilayer microelectronic device package including one or more vertical electrical contacts according to claim 14 wherein a CMOS imaging device is formed in the semiconductor material layer.

20. A multilayer microelectronic device package including one or more vertical electrical contacts according to claim 14 wherein the stud-containing layer is a glass layer.

* * * * *